United States Patent [19]
Kabeta et al.

[11] Patent Number: 5,895,156
[45] Date of Patent: Apr. 20, 1999

[54] HEAT TRANSFER DEVICE FOR SHEET ASSEMBLY

[75] Inventors: Katsutoshi Kabeta; Hiroyuki Kushida, both of Gunma; Yoshihiro Koyanagi, Kanagawa, all of Japan

[73] Assignee: Fuji Photo Film Co., LTD., Kanagawa, Japan

[21] Appl. No.: 08/888,328

[22] Filed: Jul. 3, 1997

[30] Foreign Application Priority Data

Jul. 5, 1996 [JP] Japan ................. 8-194143

[51] Int. Cl.⁶ ................................... B41J 2/00
[52] U.S. Cl. ...................... 400/120.01; 347/223
[58] Field of Search .................. 101/488; 400/719, 400/124.03, 124.13, 120.01; 347/223

[56] References Cited

U.S. PATENT DOCUMENTS

| | | | |
|---|---|---|---|
| 4,962,314 | 10/1990 | Hirota et al. | 250/318 |
| 5,211,493 | 5/1993 | Stephenson et al. | 347/223 |
| 5,296,873 | 3/1994 | Russell et al. | 101/488 |
| 5,374,944 | 12/1994 | Janosky et al. | 347/223 |

FOREIGN PATENT DOCUMENTS

| | | | |
|---|---|---|---|
| 0 163 300 | 12/1985 | European Pat. Off. | G03D 9/00 |
| 0 640 473 | 3/1995 | European Pat. Off. | B32B 31/00 |
| 5-262012 | 10/1993 | Japan | 347/223 |
| 1155524 | 6/1969 | United Kingdom | G03B 27/26 |

*Primary Examiner*—Ren Yan
*Attorney, Agent, or Firm*—Sughrue, Mion, Zinn, Macpeak & Seas, PLLC

[57] ABSTRACT

A heat transfer device for sheet assembly for the heat transfer of an image on a transfer sheet to a receptor sheet for printing by inserting a sheet assembly comprising the transfer sheet on which an image has been formed and a receptor sheet for printing superimposed on an auxiliary plate into an inlet opening portion formed on a casing along an inlet stand, and passing between a pair of heat pressure rolls arranged inside the casing, includes: an exhaust fan for taking the outside air from the inlet opening portion toward the pair of the heat pressure rollers for cooling the pair of the heat pressure rollers; and aperture maintaining means for maintaining air passage for allowing the intake of the outside air between the upper edge portion of the inlet opening portion and the upper surface of the sheet assembly at the time of inserting the sheet assembly into the inlet opening portion. Accordingly, the pair of the heat pressure rollers can be securely cooled by the outside air via the air passage.

7 Claims, 6 Drawing Sheets

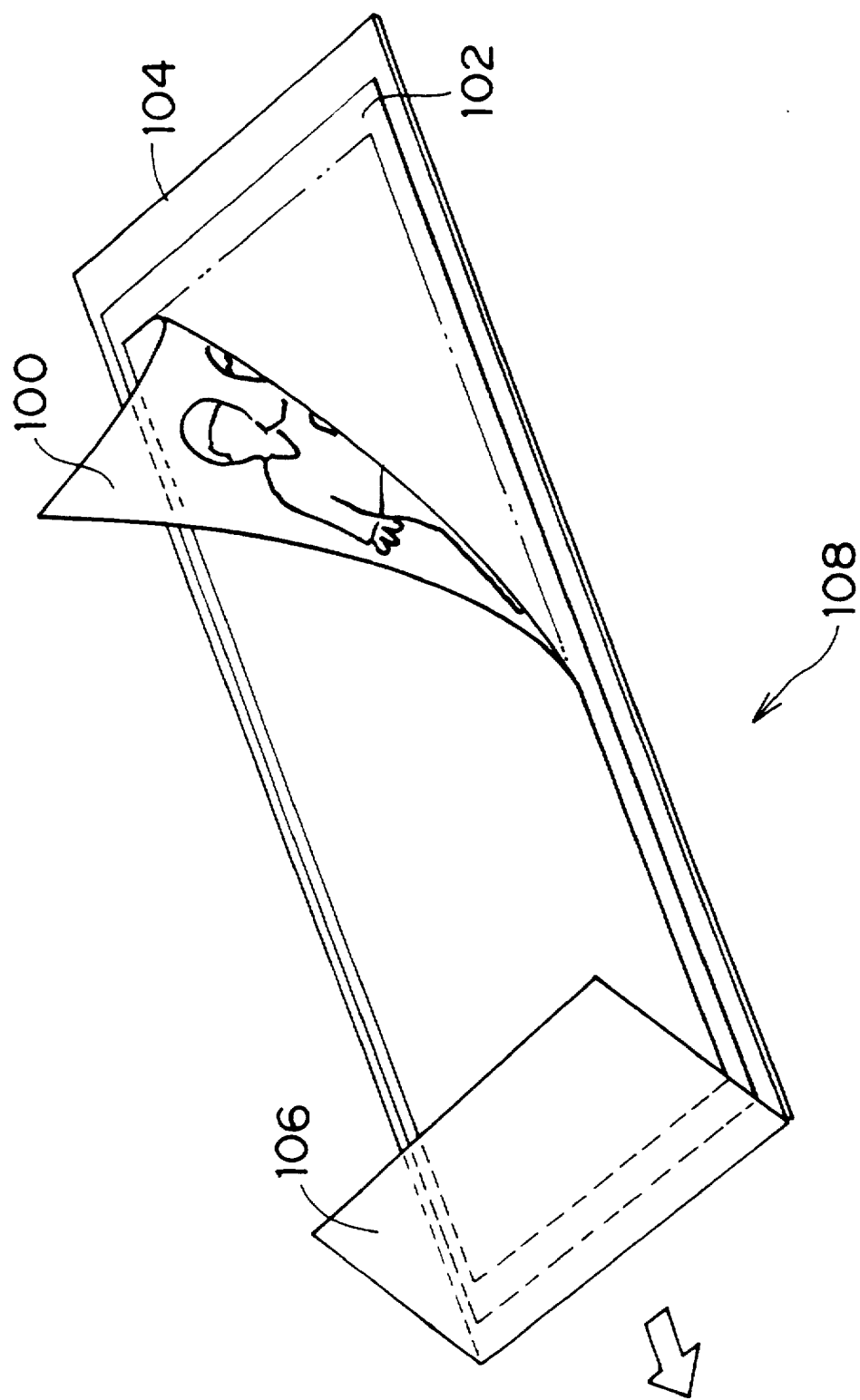

HEAT TRANSFER DEVICE FOR SHEET ASSEMBLY

BACKGROUND OF THE INVENTION

1. Field of the invention

The present invention relates to a heat transfer device for sheet assembly or a laminator, wherein the sheet assembly comprising a transfer sheet on which an image has been formed and a receptor sheet for printing superimposed on an auxiliary plate passes between a pair of heat pressure rollers so as to heat transfer the image on the transfer sheet onto the receptor sheet for printing.

2. Description of the Related Art

When an image is digitally processed and the image is transferred onto a transfer sheet with a printer based on the digital data, an image with a rich tone can be reproduced, realizing a sharp image quality. Since the tone of the image obtained a printed matter obtained by the offset printing of the image on the transfer sheet is slightly different from the tone of the image on the transfer sheet, a printing sample applied with color correction beforehand is necessary in order to grasp the finished image on the printed matter accurately.

As a device for producing the printing sample, recent attention is paid to a heat transfer device for sheet assembly (laminator). The heat transfer device for sheet assembly is constructed to transfer an image on a transfer sheet 100 onto a receptor sheet for printing by inserting a sheet assembly 108 comprising a transfer sheet 100 on which an image has been formed and a receptor sheet for printing 102 superimposed on an auxiliary plate 104 of an aluminum plate of about 0.3 mm thickness, further applied with a cover sheet 106 thereon, from an inlet opening formed on a casing along an inlet stand, and passing between a pair of heat pressure rollers. By the use of an ink ribbon applied with a thin film containing a pigment matched with the hue of a printing ink for printing an image on a transfer sheet based on digital data, a printing sample excellently exact to the actual printed matter at the time of the heat transfer of the image on the transfer sheet on the receptor sheet for printing can be provided stably.

In the heat transfer device for sheet assembly, the pair of heat pressure rolls comprise soft rollers comprising core rollers of metal pipes, of which surface covered with a soft synthetic resin such as silicone rubber, and built-inheat lamps. In order to obtain a printing sample exact to the actual printed matter, it is necessary to have the temperature of the heat pressure rollers homogeneously as much as possible at the time of the heat transfer by pressing the transfer sheet onto the receptor sheet for printing with the heat pressure rollers. If the temperature of the heat pressure rollers rises during the heat transfer process, not only inconveniences occur such as uneven transfer and generation of wrinkles in the receptor sheet for printing due to difficulty of peeling off the transfer sheet and the receptor sheet for printing, but also deterioration of the heat pressure rollers due to the temperature higher than the bearable temperature of the soft synthetic resin.

Therefore, the temperature of the heat pressure rollers is measured by a sensor for thyristor control of the power inputted to the heater lamps arranged in the heat pressure rollers. In order to prevent casting heat effect on other electric control parts in the casing, the temperature rise of the heat pressure rollers is prevented by covering the heat pressure rollers with roller covers as well as providing an exhaust fan at the bottom of the casing for taking cooling air from the inlet opening and cooling the heat pressure rollers.

Since the transfer sheet and the receptor sheet for printing adsorb moisture, the moisture may be evaporated by the heat of the heat pressure rollers so that the sheet assembly curls at the time of inputting from the inlet opening formed on the casing along the inlet stand. As to the auxiliary plate, even though it comprises an aluminum plate, in the case the thickness is about 0.3 mm, "warpage" would generate over a long term use. Accordingly, the sheet assembly may contact to the upper edge or surface of the inlet opening and choke the inlet opening due to deformation. In this case, intake of the cooling air from the inlet opening is bothered, resulting in extraordinary temperature rise of the heat pressure rollers.

SUMMARY OF THE INVENTION

Accordingly, an object of the present invention is to provide a heat transfer device for sheet assembly without the risk of completely choking the inlet opening, which is the intake opening of the cooling air with a deformed sheet assembly at the time of inserting the sheet assembly from the inlet opening formed on the casing along the inlet stand so that the temperature rise of the heat pressure rollers is prevented.

In order to achieve the above-mentioned object, a first aspect of the present invention is a heat transfer device for sheet assembly for heat transfer of an image on a transfer sheet to a receptor sheet for printing by inserting a sheet assembly comprising the transfer sheet on which an image has been formed and a receptor sheet for printing superimposed on an auxiliary plate into an inlet opening portion formed on a casing along an inlet stand, and passing between a pair of heat pressure rolls arranged inside the casing, comprising:

an exhaust fan for taking the outside air from the inlet opening portion toward the pair of the heat pressure rollers for cooling the pair of the heat pressure rollers; and an air passage maintaining means for maintaining the air passage for allowing the intake of the outside air between the upper edge portion of the input opening portion and the upper surface of the sheet assembly at the time of inserting the sheet assembly into the inlet opening portion.

According to this aspect, since the air passage is maintained between the upper edge portion of the inlet opening portion and the upper surface of the sheet assembly even if the sheet assembly is deformed, the intake of the outside air by the exhaust fan toward the pair of the heat pressure rollers is ensured.

A second aspect comprises a protruding portion extending toward the pair of the heat pressure rollers from the inlet opening portion as the air passage maintaining means in the first aspect.

A third aspect comprises the protruding portion provided in a plurality along the transverse direction of the inlet opening portion in the second aspect.

In a fourth aspect, the pair of the heat pressure rollers are covered with a cover member comprising openings for allowing passage of the sheet assembly along the conveyance direction of the sheet assembly, with the cover member provided with a guiding means for guiding the air inside the cover member to the exhaust fan direction in the first aspect.

In a fifth aspect, the exhaust fan is arranged on one side with respect to the conveyance direction of the sheet assembly, and the guiding means comprises a limiting member for limiting discharge of the air inside the cover member to the other side with respect to the conveyance direction of the sheet assembly in the first aspect.

In a sixth aspect, the guiding means comprises a promoting portion for promoting the discharge of the air inside the cover member to the one side with respect to the conveyance direction of the sheet assembly in the fifth aspect.

A seventh aspect further comprises a housing having the inlet opening portion and an outlet opening portion for discharging the sheet assembly inserted from the inlet opening portion, with a part of the housing in the vicinity of the outlet opening portion at the other side with respect to the conveyance direction of the sheet assembly providing an inflow preventing portion of the outside air.

BRIEF DESCRIPTION OF THE DRAWINGS

FIG. 6 is a perspective view of a sheet assembly.

DESCRIPTION OF THE EMBODIMENT

Figure 1:
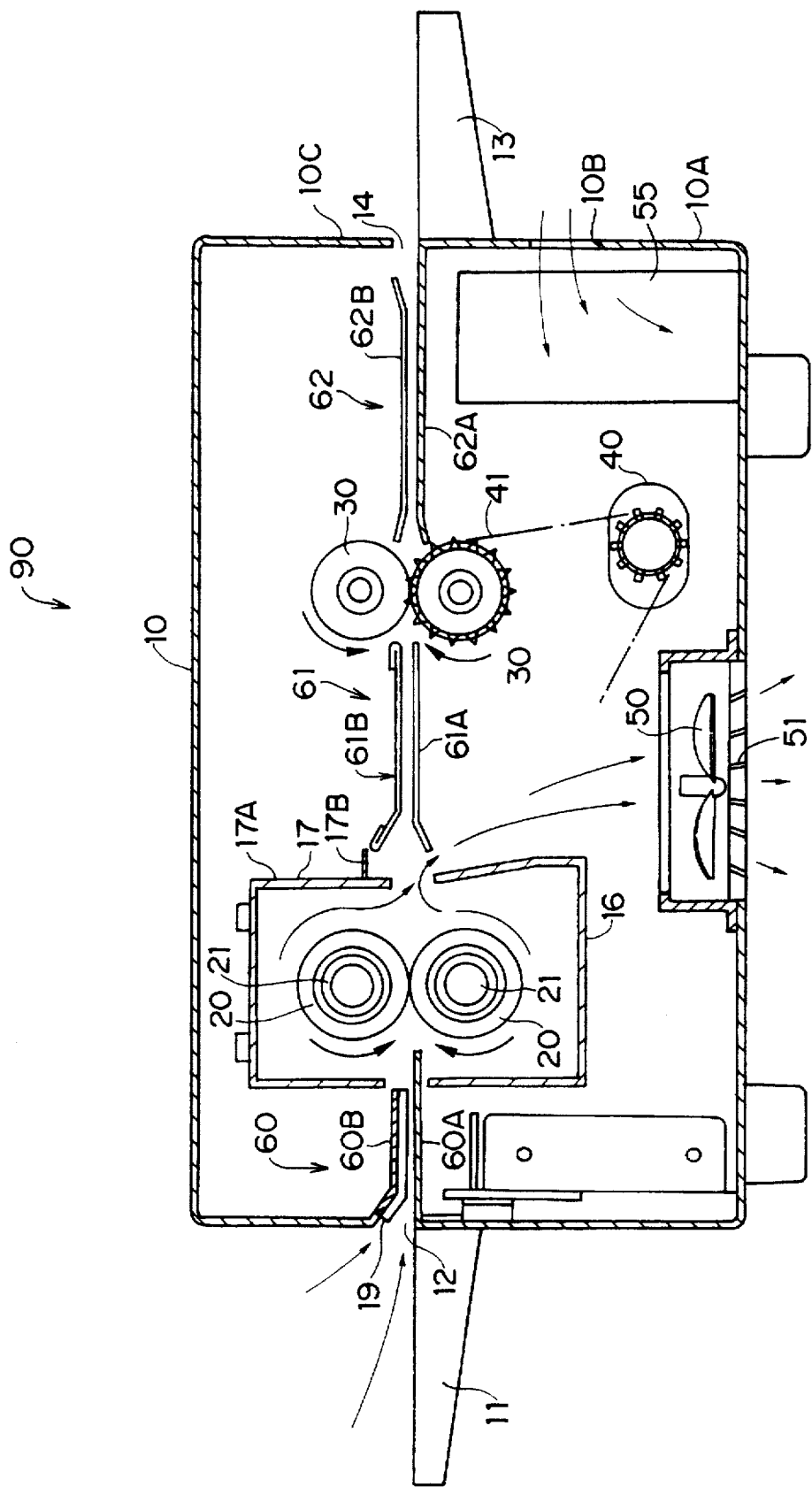
FIG. 1 is a sectional diagram of an embodiment of a heat transfer device for sheet assembly of the present invention.
Figure 5:
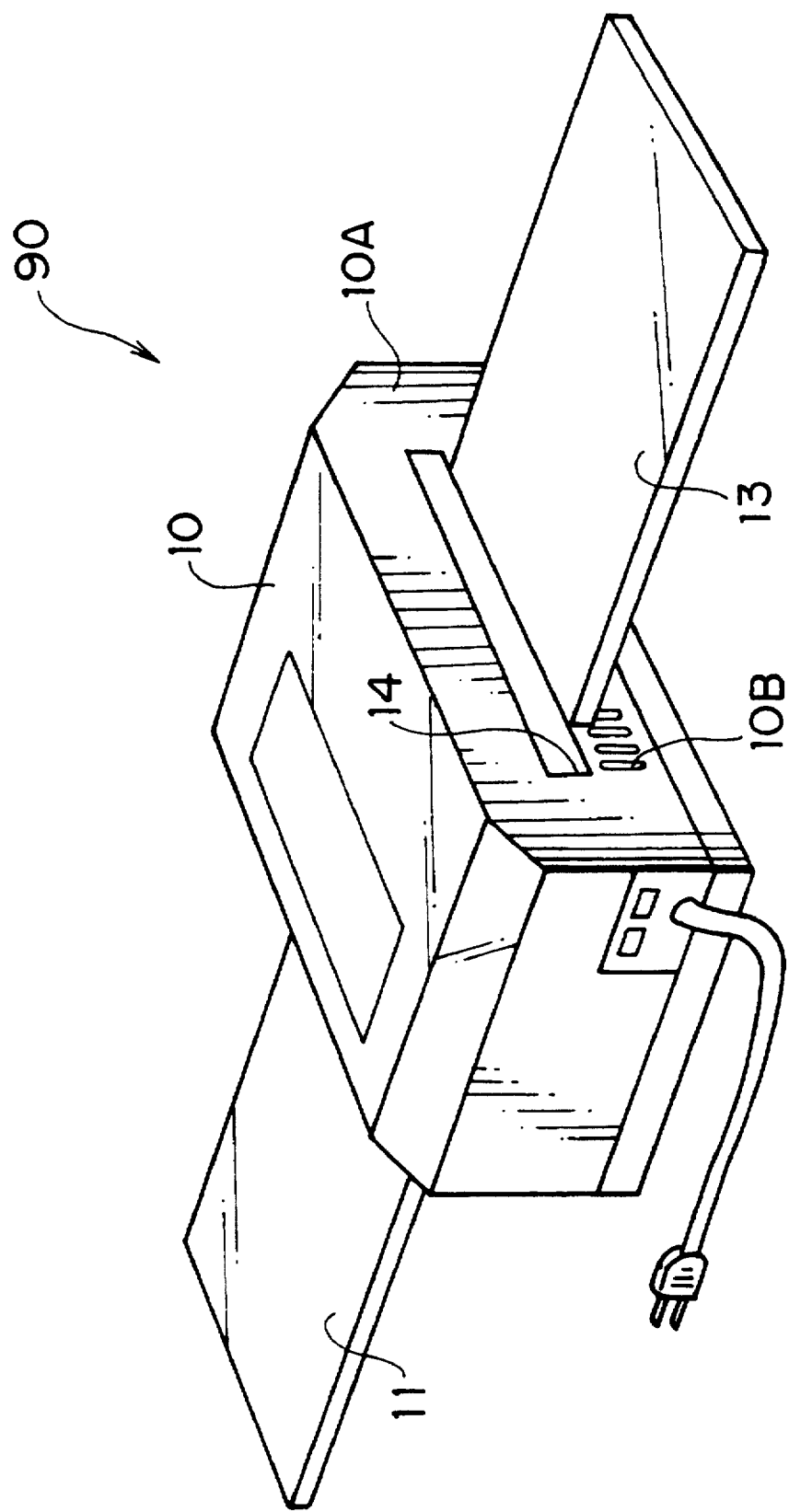
FIG. 5 is an outside appearance perspective view of the embodiment of the heat transfer device for sheet assembly of the present invention.

Hereinafter an embodiment of the present invention will be explained in detail with reference to drawings. As shown in FIGS. 1 and 5, a sheet heating device or laminator 90 comprises a substantially rectangular-shaped casing or housing 10. The casing 10 is provided with an inlet stand 11 and an outlet stand 13 at the both sides. An inlet opening 12 is formed on the casing 10 along the inlet stand 11, and an outlet opening 14 is formed on the casing 10 along the outlet stand 13. Furthermore, guiding means 60, 61, and 62 are successively provided at the same level as that of the inlet stand 11 and the outlet stand 13 in the casing 10 along the conveyance direction of a sheet assembly 108 shown in FIG. 6. The guiding means 60 comprises a lower guiding plate 60A and an upper guiding plate 60B, the guiding means 61 comprises a lower guiding plate 61A and an upper guiding plate 61B, and the guiding means 62 comprises a lower guiding plate 62A and an upper guiding plate 62B.

A pair of heat pressure rollers 20 and 20 are provided rotatably and vertically, contacted to each other with pressure between the guiding means 60 and the guiding means 61. A pair of discharge rollers 30 and 30 are provided rotatably and vertically, contacted to each other with pressure between the guiding means 61 and the guiding means 62. The heat pressure rollers 20 and the discharge rollers 30 are rotated by a chain 41 wound around sprockets on the output shaft of a driving motor 40 to the directions shown with arrows synchronically.

The heat pressure rollers 20 and the discharge rollers 30 comprise soft rollers comprising metal pipes, of which surface covered with a soft synthetic resin such as silicone rubber. Rod-shaped halogen lamps of a normal rated power of 1360 W are provided inside the heat pressure rollers 20 as heater lamps 21. The surface temperature of the heat pressure rollers 20 heated by the heater lamps 21 is controlled at a preferable temperature range, for example about 170° C., which is lower than the bearable temperature of the silicone rubber. The heat pressure rollers 20 are covered with a lower roller cover 16 and an upper roller cover 17 so that an adverse effect of the heat from the heat pressure rollers 20 on the other electric control parts arranged in the casing 10 can be prevented. A baffle plate 17B is provided from a side wall 17A of the upper roller cover 17 on the guiding means 61 side toward the upper guiding plate 61B with small gap between the baffle plate 17A and the upper guiding plate 61B so as to limit the air passage through the small gap. That is, the baffle plate 17B serves as a limiting member for limiting the air flow in the space formed by the lower roller cover 16 and the upper roller cover 17. A side wall 16A of the lower roller cover 16 on the guiding means 61 side is bent to the direction away from the lower guiding plate 61A so that a large gap is provided between the side wall 16A and the lower guiding plate 61A. That is, the bend of the side wall 16A serves as a promoting portion for promoting the air outflow from the space formed by the lower roller cover 16 and the upper roller cover 17. Accordingly, the air outflow from the space formed by the lower roller cover 16 and the upper roller cover 17 is facilitated. As heretofore mentioned, the limiting member and the promoting portion comprise a guiding portion of the air in the space to the outside.

The upper guiding plate 60B forming the inlet opening 12 will be explained in detail with reference to FIGS. 2 and 3. The upper guiding plate 60B has a substantially rectangular shape when viewed two-dimensionally, and the inlet opening 12 and the portion in the vicinity provide an upwardly bent inclined portion 60C. Two protruding portions 19A protruding downward and serving as air passage maintaining means are formed on the upper guiding plate 60B. The protruding portions 19A have a substantially-inverse trapezoid cross-sectional shape with the protruding height of about 1.0 mm to 1.68 mm, preferably 1.5 mm. The cross-sectional shape of the protruding portions 19 is not limited to the substantially-trapezoid shape, but can be a curved shape. Any shape can be applied as long as air passage can be provided for passing sufficient cooling air for cooling the heat pressure rollers 20 between the sheet assembly 108 and the upper surface or edge of the inlet opening portion 12 when the sheet assembly 108 is deformed and contacted with the protruding portion 19. The number of the protruding portion 19 is not limited to two as mentioned above.

An exhaust fan 50 is provided at the bottom portion of the casing 10. By operating the exhaust fan 50, cooling air (outside air) is taken in from the inlet opening portion 12 so as to enter the space covered with the lower roller cover 16 and the upper roller cover 17 for cooling the heat pressure rollers 20. After cooling the heat pressure rollers 20, the cooling air is discharged by the exhaust fan 50 from the discharging opening formed at the bottom of the casing 10. A fin guard 51 is provided at the lower surface of the exhaust fan 50.

Figure 2:
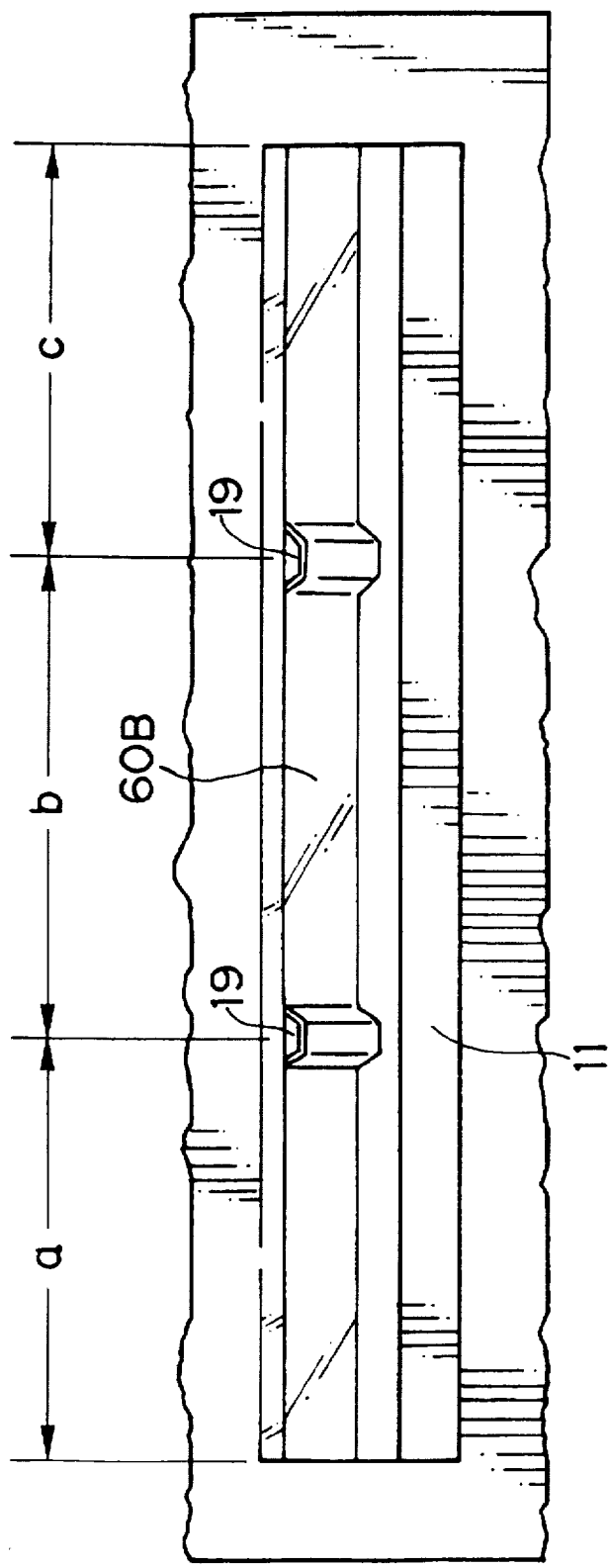
FIG. 2 is a plan view of the inlet opening portion the embodiment of the heat transfer device for sheet assembly of the present invention.
Figure 3:
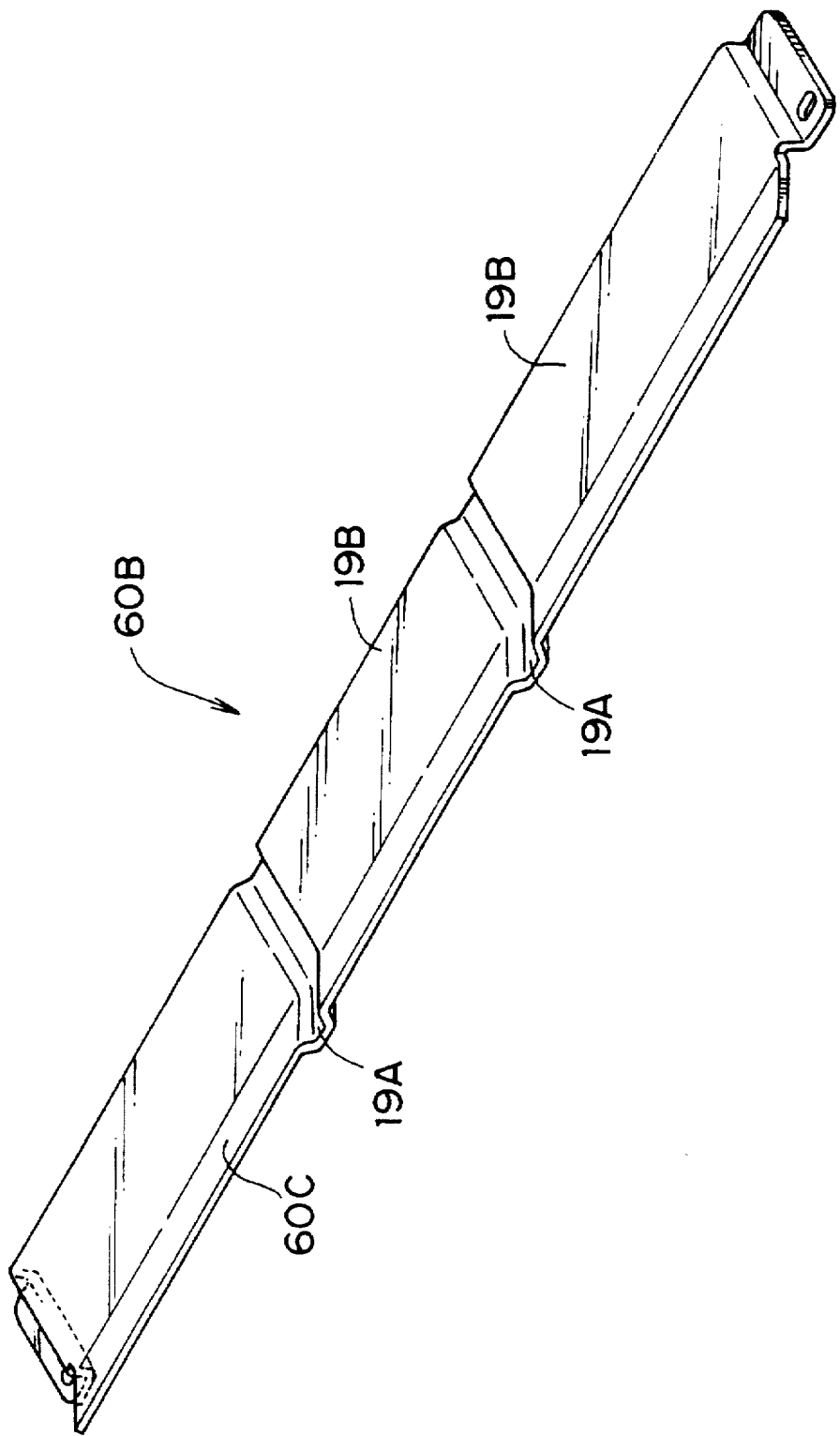
FIG. 3 is a perspective view of a guiding plate of the embodiment of the heat transfer device for sheet assembly of the present invention.

As shown in FIG. 2, a control device 55 comprising electric control parts is provided below the conveyance path of the sheet assembly 108 in the casing 10. A plurality of slits 10B (see FIG. 5) are provided on the side wall 10A of the casing 10 in the vicinity of the control device 55 at a downward position with respect to the conveyance path so that the outside air for cooling is supplied to the control device 55 via the slits 10B for cooling the control device 55. A slit is not formed on the side wall 10A of the casing 10 in a position above with respect to the conveyance path so that the upper portion provide an inflow preventing portion 10C for preventing the inflow of the outside air into the casing 10.

The operation of a heat device for a sheet 90 of an embodiment with the above-mentioned configuration of the present invention will be explained.

A transfer sheet 100 on which an image has been formed based on digital data and a receptor sheet for printing 102 are superimposed on the auxiliary plate 104 comprising an aluminum plate of a 0.3 mm thickness so as to form a sheet assembly 108. When the sheet assembly 108 is inserted from the inlet opening portion 12 formed on the casing 10 along the inlet stand 11, the sheet assembly 108 is guided by the guiding means 60 so that the leading edge of the sheet assembly 108 is inserted between the pair of heat pressure rollers 20. Since the sheet assembly 108 is pressed in a heated state by the pair of the heat pressure rollers 20 in a rotating state, it is conveyed while the image on the transfer sheet 100 is heat transferred onto the receptor sheet for printing 102. The sheet assembly 108 is guided by the guiding means 61, further conveyed by the discharge rollers 30, passes through the guiding means 62, and is discharged from the outlet opening portion 14.

When the sheet assembly 108 is inserted from the inlet opening 12 formed on the casing 10 along the inlet stand 11, as mentioned above, the sheet assembly 108 may be deformed. However deformation it may be, since the protruding portions 19 are formed on the upper guiding plate 60B of the inlet opening portion 12, the sheet assembly 108 contacts only with the protruding portions 19A and thus does not contact with flat portions 19B. Accordingly, an air path for passing sufficient cooling air (outside air) passage for cooling the heat pressure rollers 20 can be provided between the sheet assembly 108 and the upper surface of the inlet opening portion 12, as well as since the gap between the side wall 16A and the lower guiding plate 61A is set to be large, the air can be introduced by the exhaust fan 50 to the space covered with the lower roller cover 16 and the upper roller cover 17 via the gap between the upper guiding plate 60B and the sheet assembly 108 for cooling the heat pressure rollers 20, and the heated air in the space covered with the lower roller cover 16 and the upper roller cover 17 is discharged via the large gap between the side wall 16A and the lower guiding plate 61A. Therefore, since the heat pressure rollers 20 can be controlled at a constant temperature without temperature rise during the conveyance of the sheet assembly 108, problems such as uneven transfer and generation of wrinkles in the receptor sheet for printing due to difficulty of peeling off the transfer sheet and the receptor sheet for printing do not occur, and thus a transfer image extremely exact to the actual printed matter can be obtained on the receptor sheet.

A preferable temperature for the upper heat pressure roller 20 is 160° C. to 190° C., and a preferable temperature for the lower heat pressure roller 20 is 150° C. to 180° C.

EXAMPLE

Figure 4:
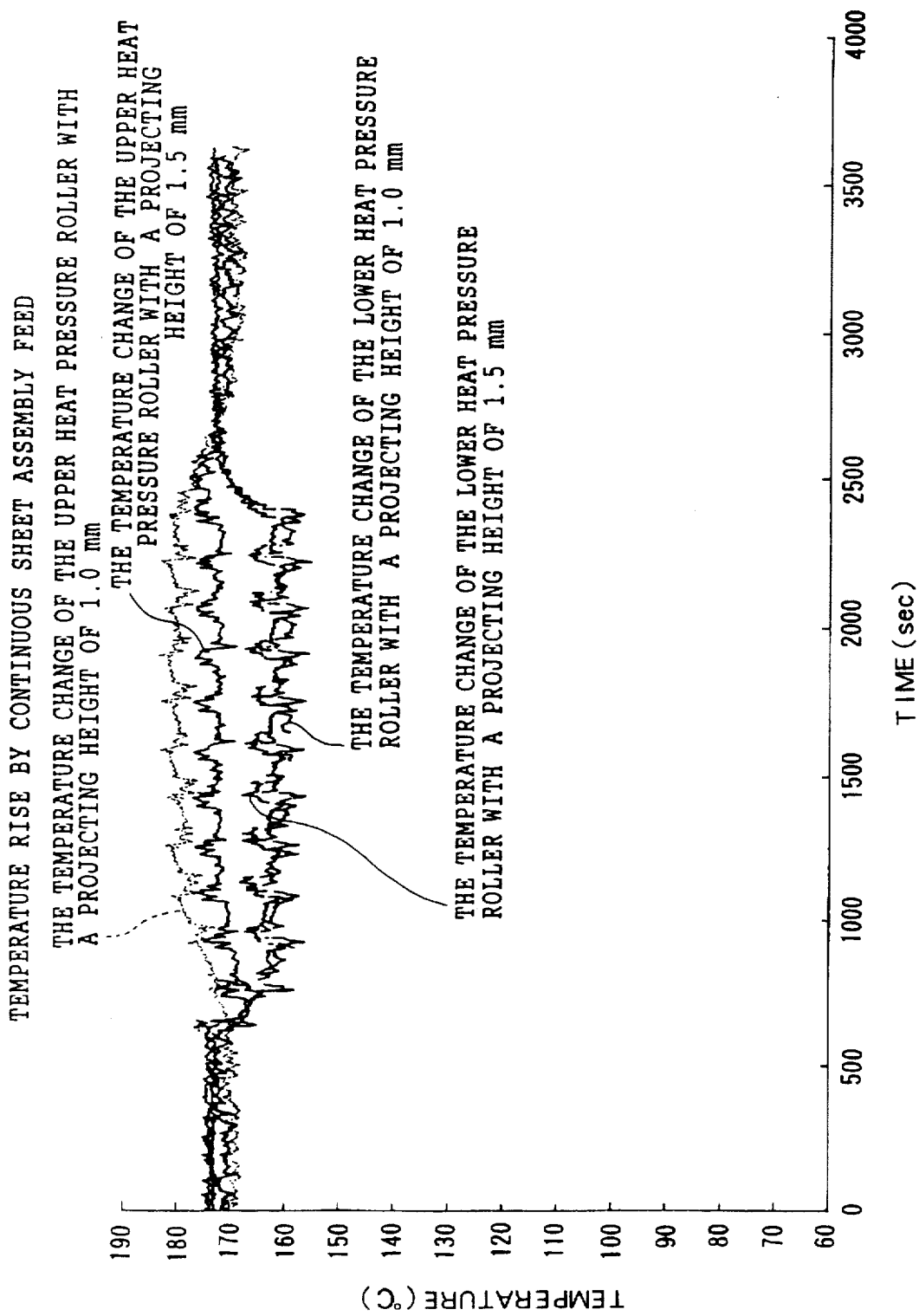
FIG. 4 is a graph showing data of an experiment of the embodiment of the heat transfer device for sheet assembly of the present invention.

FIG. 4 shows data of temperature rise by continuous paper or assembly feed. In FIG. 4, the solid line shows the temperature change of the upper heat pressure roller 20 with the protruding portions 19 of a projecting height of 1.5 mm, and the broken line (chain line) shows the temperature change of the lower heat pressure roller 20 with the protruding portions 19 of a projecting height of 1.5 mm. The dot line shows the temperature change of the upper heat pressure roller 20 with the protruding portions 19 of a projecting height of 1.0 mm, and the dashed line shows the temperature change of the lower heat pressure roller 20 with the protruding portions 19 of a projecting height of 1.0 mm. The distance shown in FIG. 2 was 100 mm, the distance b was 140 mm, and the distance c was 100 mm.

As can be understood from the results of this experiment, with the projecting height of the protruding portions 19 of 1.5 mm, particularly preferable results were obtained.

What is claimed is:

1. A heat transfer device for sheet assembly for the heat transfer of an image on a transfer sheet to a receptor sheet for printing by inserting a sheet assembly comprising the transfer sheet on which an image has been formed and a receptor sheet for printing superimposed on an auxiliary plate into an inlet opening portion formed on a casing along an inlet stand, and passing between a pair of heat pressure rolls arranged inside the casing, comprising:

an exhaust fan for taking the outside air from the inlet opening portion toward the pair of the heat pressure rollers for cooling the pair of the heat pressure rollers; and an air passage maintaining means for maintaining air passage for allowing the intake of the outside air between the upper edge portion of the inlet opening portion and the upper surface of the sheet assembly at the time of inserting the sheet assembly into the inlet opening portion.

2. The heat transfer device for sheet assembly according to claim 1, in which the air passage maintaining means includes a protruding portion elongating toward the pair of the heat pressure rollers from the inlet opening portion.

3. The heat transfer device for sheet assembly according to claim 2, in which the protruding portion is provided in a plurality along the transverse direction of the inlet opening portion.

4. The heat transfer device for sheet assembly according to claim 1, wherein the pair of the heat pressure rollers are covered with a cover member comprising opening for allowing passage of the sheet assembly along the conveyance direction of the sheet assembly, with the cover member provided with a guiding means for guiding the air inside the cover member to the exhaust fan direction.

5. The heat transfer device for sheet assembly according to claim 4, wherein the exhaust fan is arranged on one side with respect to the conveyance direction of the sheet assembly, and the guiding means comprises a limiting member for limiting discharge of the air inside the cover member to the other side with respect to the conveyance direction of the sheet assembly.

6. The heat transfer device for sheet assembly according to claim 5, wherein the guiding means comprises a promoting portion for promoting the discharge of the air inside the cover member to the one side with respect to the conveyance direction of the sheet assembly.

7. The heat transfer device for sheet assembly according to claim 1, further comprising a housing having the inlet opening portion and a discharging opening portion for discharging the sheet assembly inserted from the inlet opening portion, with a part of the housing in the vicinity of the discharging opening portion at the other side with respect to the conveyance direction of the sheet assembly providing an inflow preventing portion of the outside air.

* * * * *